(12) United States Patent
Lin et al.

(10) Patent No.: US 12,500,089 B2
(45) Date of Patent: Dec. 16, 2025

(54) WAFER POLISHING METHOD AND WAFER PRODUCING METHOD

(71) Applicant: SUMCO Corporation, Tokyo (JP)

(72) Inventors: Chih Hao Lin, Taipei (TW); Kazushige Takaishi, Taipei (TW)

(73) Assignee: SUMCO CORPORATION, Tokyo (JP)

( * ) Notice: Subject to any disclaimer, the term of this patent is extended or adjusted under 35 U.S.C. 154(b) by 432 days.

(21) Appl. No.: 18/257,710

(22) PCT Filed: Oct. 28, 2021

(86) PCT No.: PCT/JP2021/039884
§ 371 (c)(1),
(2) Date: Jun. 15, 2023

(87) PCT Pub. No.: WO2022/130800
PCT Pub. Date: Jun. 23, 2022

(65) Prior Publication Data
US 2024/0055264 A1  Feb. 15, 2024

(30) Foreign Application Priority Data

Dec. 18, 2020  (JP) .................................. 2020-210662

(51) Int. Cl.
*H01L 21/306*  (2006.01)
*B24B 1/00*  (2006.01)
(Continued)

(52) U.S. Cl.
CPC .......... *H01L 21/30625* (2013.01); *B24B 1/00* (2013.01); *B24B 37/00* (2013.01);
(Continued)

(58) Field of Classification Search
None
See application file for complete search history.

(56) References Cited

U.S. PATENT DOCUMENTS

| | | |
|---|---|---|
| 2002/0076933 A1 | 6/2002 | Kawamura et al. |
| 2017/0178890 A1 | 6/2017 | Chu et al. |
| 2020/0039021 A1 | 2/2020 | Kubota et al. |

FOREIGN PATENT DOCUMENTS

| | | |
|---|---|---|
| JP | 2002-184733 A | 6/2002 |
| JP | 2003-285262 A | 10/2003 |
| JP | 2018-074086 A | 5/2018 |

OTHER PUBLICATIONS

E. Estragnat et al., "Experimental Investigation on Mechanism pf Silicon Chemical Mechanical Polishing", Journal of Electronic Materials, vol. 33, pp. 334-339. (Year: 2004).*

(Continued)

*Primary Examiner* — Jiong-Ping Lu
(74) *Attorney, Agent, or Firm* — GREENBLUM & BERNSTEIN, P.L.C.

(57) ABSTRACT

Provided is a wafer polishing method comprising: a step of determining a first correlation a second correlation; a step of calculating mechanical polishing rate/chemical polishing rate; a step of obtaining a relationship between the ratio of the mechanical polishing rate to the chemical polishing rate and one or more indications of wafer flatness and determining a specific range of the ratio of the mechanical polishing rate to the chemical polishing rate; a step of selecting a first target polishing solution that meets the specific range of the ratio of the mechanical polishing rate to the chemical polishing rate based on the first correlation and the second correlation; and a step of polishing wafers using the first target polishing solution. Also provided is a wafer production method including a step of performing a polishing process by the above wafer polishing method.

13 Claims, 8 Drawing Sheets

(51) Int. Cl.
  *B24B 37/00* (2012.01)
  *B24B 37/005* (2012.01)
  *B24B 37/04* (2012.01)
  *C09G 1/02* (2006.01)
  *H01L 21/02* (2006.01)
  *H01L 21/66* (2006.01)

(52) U.S. Cl.
  CPC .......... *B24B 37/005* (2013.01); *B24B 37/044* (2013.01); *C09G 1/02* (2013.01); *H01L 21/02024* (2013.01); *H01L 22/12* (2013.01)

(56) References Cited

OTHER PUBLICATIONS

Estragnat et al., "Experimental Investigation on Mechanisms of Silicon Chemical Mechanical Polishing", Journal of Electronic Materials, vol. 33, No. 4, pp. 334-339.
Office Action issued in Taiwan Patent Appl. No. 110101602, dated Nov. 10, 2021, translation.
Office Action issued in Taiwan Patent Appl. No. 110101602, dated Jan. 28, 2022, translation.
ISR issued in International Patent Application No. PCT/JP2021/039884, Dec. 21, 2021, translation.
IPRP issued in International Patent Application No. PCT/JP2021/039884, Jun. 13, 2023, translation.

* cited by examiner

Correlation between variation of M/C ratio and thickness distribution (GBIR)

FIG. 8

Correlation between variation of M/C ratio and peripheral flatness (ESFQR)

FIG. 9

Correlation between variation of M/C ratio and thickness distribution (GBIR)

FIG. 10

Correlation between variation of M/C ratio and peripheral flatness (ESFQR)

WAFER POLISHING METHOD AND WAFER PRODUCING METHOD

TECHNICAL FIELD

This disclosure relates to a wafer polishing method and a wafer producing method, and particularly relates to a wafer polishing method and a wafer producing method in which the flatness of a wafer is controlled based on the relation of a mechanical polishing rate to a chemical polishing rate.

BACKGROUND

In recent years, as semiconductor devices are rapidly integrated increasingly, silicon wafers included as components are required to be even flatter. Further, with a view to further reducing the production cost of semiconductor devices, the diameter of silicon wafers is increasingly increased, and accordingly it becomes more difficult to perform polishing for obtaining wafers having required flatness.

To address this, JP 2003-285262 A PTL 1 discloses a method of double-side polishing silicon wafers, comprising retaining silicon wafers in carrier plates; placing the wafers between upper and lower plates to each of which a polishing cloth is pasted; then flowing a polishing solution to between the polishing cloths and the silicon wafer surfaces; and revolving and rotating the carrier plates using a sun gear and an internal gear, and in the method, abrasive grains (for example silica: $SiO_2$) contained in the polishing solution remains on the polishing cloth surfaces and allows polishing of both surfaces of the silicon wafers.

CITATION LIST

Patent Literature

PTL 1: JP 2003-285262 A

SUMMARY

Technical Problem

Here, polishing performed to achieve a state where the thickness of polished wafers becomes equal to or less than the thickness of carrier plates in double-side polishing is referred to as "sizing polishing". On the other hand, polishing after which the thickness of wafers is larger than the thickness of carrier plates is referred to as "unsizing polishing". The shape of wafers having been subjected to double-side polishing is a "concave shape" in which a center portion is thin and a peripheral portion is thick and which the global thickness distribution forms when the double-side polishing is unsizing polishing. In sizing polishing, the recessed shape of the "concave shape" is likely to be excessively recessed; the carrier plates would greatly wear; and the polishing time would be long.

Under such circumstances, in order to increase the flatness of wafers and inhibit the wear of carrier plates and reduce the polishing time, many tests are necessarily performed to determine optimum polishing conditions; and particularly when a significant change such as change of the polishing environment is made (for example, a machine is replaced), a plurality of lots of wafers need to be repeatedly polished and subjected to tests many times, so that optimum polishing conditions cannot be determined without spending a large cost and time. Accordingly, polishing conditions resulting in good wafer flatness along with effectively reduced test time are sought.

In view of the above challenges, it could be helpful to provide a wafer polishing method and a wafer producing method that can accurately control the wafer shape at the same time as effectively reducing the test time.

Solution to Problem

This disclosure primarily includes the following features.
In one embodiment, a wafer polishing method includes:
a step of determining a first correlation that is a correlation between an alkali concentration and a chemical polishing rate, using a plurality of polishing solutions with different alkali concentrations and determining a second correlation that is a correlation between an abrasive grain concentration and a mechanical polishing rate, using a plurality of polishing solutions having different abrasive grain concentrations;
a step of calculating mechanical polishing rate/chemical polishing rate that is a ratio of the mechanical polishing rate to the chemical polishing rate for each of the plurality of polishing solutions based on the first correlation and the second correlation;
a step of obtaining a relationship between the ratio of the mechanical polishing rate to the chemical polishing rate and one or more indications of wafer flatness and determining a specific range of the ratio of the mechanical polishing rate to the chemical polishing rate;
a step of selecting a first target polishing solution that meets the specific range of the ratio of the mechanical polishing rate to the chemical polishing rate based on the first correlation and the second correlation; and
a step of polishing wafers using the first target polishing solution.

In one embodiment, a wafer production method includes slicing a single crystal ingot grown by the Czochralski process to obtain wafers to be polished, and then subjecting the wafers to be polished to the above wafer polishing method.

Advantageous Effect

This disclosure can provide a wafer polishing method and a wafer producing method that can accurately control the wafer shape at the same time as effectively reducing the test time.

BRIEF DESCRIPTION OF THE DRAWINGS

In the accompanying drawings.

DETAILED DESCRIPTION

To further clarify the features and the advantages of this disclosure, some embodiments will now be presented and described with reference to the corresponding drawings attached hereto.

With a view to make each aspect clearer and easier to understand, the aspects will now be described with reference to the drawings attached hereto. It should be noted that the devices and systems are not necessarily drawn to scale according to customary practice in the industry. In practice, by way of clarifying the description, the dimensions of the devices and systems can be optionally increased or reduced.

Some embodiments of the wafer polishing method of this disclosure will now be described. However, it should readily be understood that the embodiments in this disclosure are to provide many suitable inventive concepts and the methods of this disclosure can be widely implemented in various specific instances. The disclosed specific embodiments are merely intended to describe use of the methods of this disclosure in certain ways, and the embodiments do not limit the scope of this disclosure.

Unless otherwise specified, all the terms used herein (including technical terms and scientific terms) have the meanings that those having common knowledge in the art to which this disclosure pertains would usually understand. These terms, for example, terms as defined in commonly used dictionaries shall be construed as having the meanings matching the backdrop or the context of the related art and the methods of this disclosure unless otherwise defined herein, and should not be interpreted in an excessively strict manner.

The terms such as "about" and "approximately" used herein are normally used to refer to values within +/−20% of the value or the range following the term, preferably within +/−10% thereof, more preferably within +/−5% thereof, or within +/−3% thereof, or within +/−2% thereof, or within +/−1% thereof, or within +/−0.5% thereof. The numbers given herein are round numbers; accordingly, even when "about" or "approximately" is not used, the numbers can cover the ranges described using the terms "about" and "approximately".

The terms such as "basically" and "substantially" used herein are normally used to refer to values within 90% of a given value or range, for example values within 95% thereof, or values within 98% thereof, or values within 99% thereof.

Figure 1A:
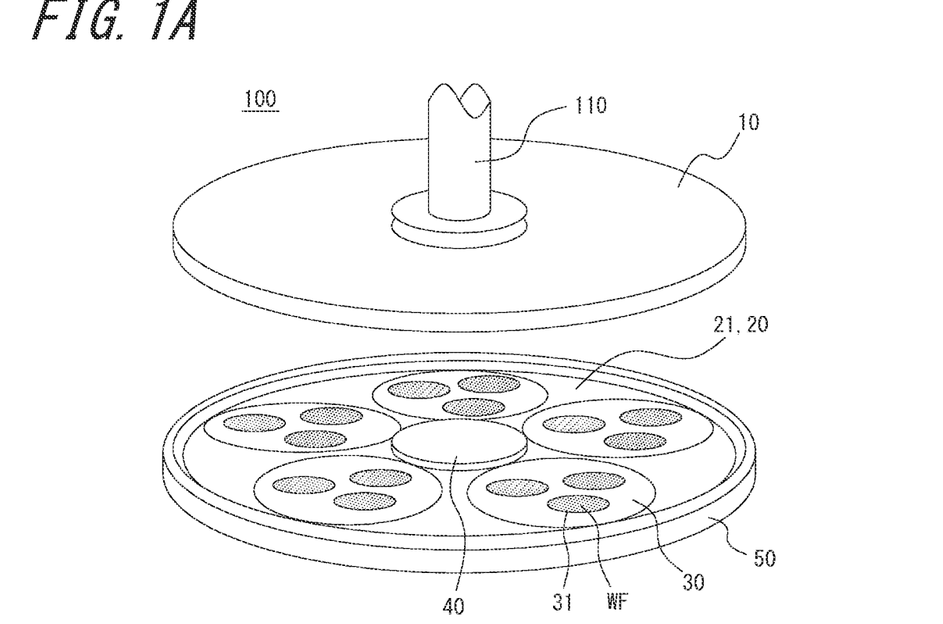
FIG. 1A is a schematic perspective view of a double-side polishing apparatus used to polish wafers according to Embodiments 1 to 4 in this disclosure.
Figure 1B:
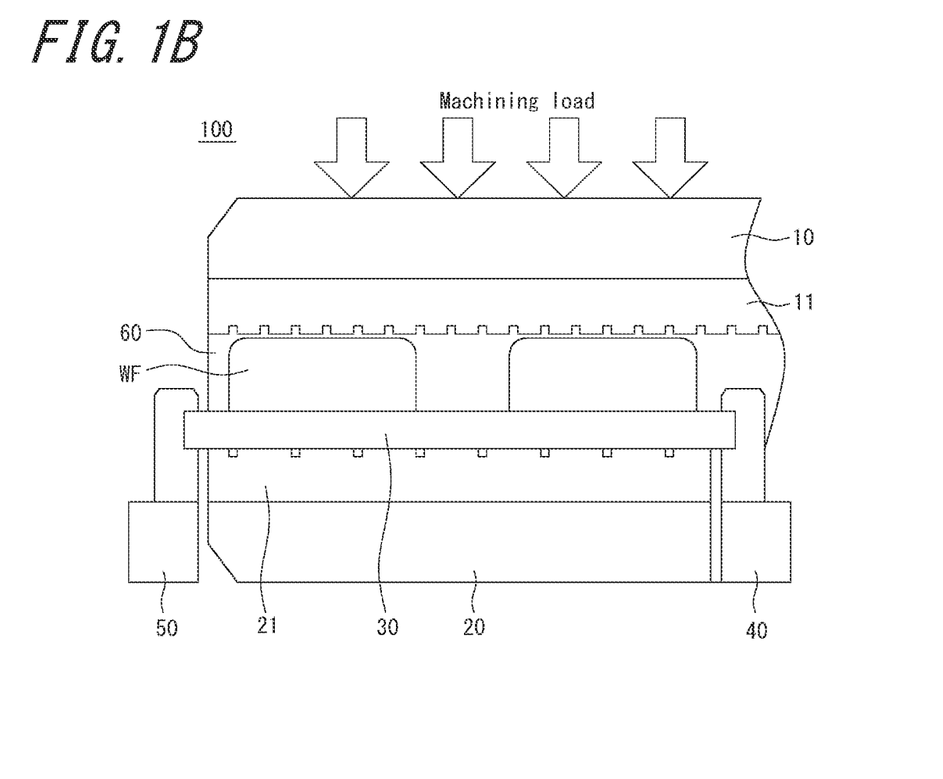
FIG. 1B is a cross-sectional view of a chief part of the double-side polishing apparatus used to polish wafers according to Embodiments 1 to 4 in this disclosure.

FIG. 1A is a schematic perspective view of a double-side polishing apparatus 100 used to polish wafers and FIG. 1B is a cross-sectional view of a chief part thereof. In Embodiments 1 to 4 of this disclosure, for example, the double-side polishing apparatus 100 as illustrated in FIG. 1A and FIG. 1B can be used; however, this disclosure is not limited thereto, and in other embodiments, a single-side polishing apparatus may be used to perform polishing.

FIG. 1A is a schematic perspective view illustrating the structure of a double-side polishing apparatus of this embodiment, and FIG. 1B is a cross-sectional view of a chief part of the structure in FIG. 1A. As illustrated in FIG. 1A, the double-side polishing apparatus 100 is configured to include an upper plate 10, a lower plate 20, a sun gear 40, an internal gear 50, and a plurality of carrier plates 30. In the carrier plates 30, one or a plurality of silicon wafers WF are held. The size of a double-side polishing apparatus is typically expressed by the diameter of the carrier plates 30, and when the carrier diameter is approximately 28 in, the size is called Type_28B, and when the carrier diameter is approximately 20 in, the sized is called Type_20B. In FIG. 1A, three wafers (for example, silicon wafers) WF are held in one carrier plate 30. In the double-side polishing apparatus 100 of Type_28B, when the diameter of the silicon wafers WF is 300 mm, typically three silicon wafers WF are held in one carrier plate 30.

Further, the upper plate 10 is configured to include an elevating mechanism 110 provided to space the upper plate 10 and the lower plate 20 apart. The upper plate 10 and the lower plate 20 are formed in a disc-like shape, and as illustrated in FIG. 1B, the lower surface of the upper plate 10 is provided with an upper polishing pad 11 that comes in contact with the upper surface of the silicon wafers WF when the silicon wafers WF are polished. Further, the upper plate 10 is perforated with a plurality of supply openings (not shown) used to supply a polishing solution 60 during polishing and to perform rinsing with pure water, so that the polishing solution 60 or pure water can be supplied to between the upper plate 10 and the lower plate 20.

The lower plate 20 is a disc-shaped body rotatably provided on a base of the double-side polishing apparatus 100, and the surface of this lower plate 20 facing the upper plate 10 is provided with a lower polishing pad 21. The lower polishing pad 21 comes into contact with the lower surface of the silicon wafers WF during polishing. The sun gear 40 is provided at an approximate center of the disc of the lower plate 20 to be rotated independently of the lower plate 20, and a teeth portion that meshes the carrier plates 30 is provided on the peripheral side surface of the sun gear 40. The internal gear 50 is formed from a ring-shaped body encircling the lower plate 20, and a teeth portion that meshes the carrier plates 30 is formed on the inner surface of the ring.

The upper plate 10, the lower plate 20, the sun gear 40, and the internal gear 50 are adapted to be rotated separately and independently by respective driving motors of which rotation shafts are joined to the respective centers of rotation of the components. The carrier plates 30 are each formed from a disc-shaped body and a teeth portion that meshes the above sun gear 40, and the internal gear 50 is formed on the peripheral side surface of the carrier plates. Further, one of a plurality of wafer retainer openings 31 are formed in the disc-shaped body, and the silicon wafers WF are held in the wafer retainer openings 31.

The double-side polishing apparatus 100 is an epicyclic gearing double-side polishing apparatus which allows planetary motion involving orbital motion and rotational motion of the carrier plates 30 by rotating the sun gear 40 and the internal gear 50. When the silicon wafers WF are polished using such a double-side polishing apparatus 100, first, the carrier plates 30 are placed on the lower plate 20, and the silicon wafers WF are held in the wafer retainer openings 31, the upper plate 10 is then lowered using the elevating mechanism 110, and with the upper plate 10 being pressed down at a predetermined pressure, the driving motors are driven while supplying the polishing solution 60 through the supply openings formed in the upper plate 10, thus the silicon wafers WF are double-side polished.

The polishing solution 60 used in the above polishing step typically contains alkaline chemicals and abrasive grains, and the polishing process proceeds due to the combined action of the chemical polishing action of the alkaline chemicals (alkali etching action) and the mechanical polishing action of the abrasive grains. Hydroxide ions (OH$^-$) in the alkaline chemicals cause a chemical action on the silicon wafer surface and form a reactive layer, thus silicon atoms are removed from the chemically reactive layer by the chemical etching action. Accordingly, the effect of the chemical polishing action of the polishing solution on the silicon wafer surface depends on the hydroxide ion concentration and the heat distribution during polishing.

Further, the mechanical polishing action causes part of silicon atoms to be aggregated on silica surfaces and removed after the abrasive grains are brought into contact with the chemically reactive layer in the silicon wafer surface. The amount removed by polishing usually differs between an inner peripheral portion and an outer peripheral portion of a silicon wafer, and the amount removed by polishing is larger in the outer peripheral portion.

According to some embodiments of this disclosure, specific examples of the alkaline chemicals include inorganic alkaline compounds, for example potassium hydroxide, sodium hydroxide, potassium hydrocarbonate, potassium carbonate, sodium hydrocarbonate, sodium carbonate, and the like; ammonium; ammonium salts, for example tetramethylammonium hydroxide, ammonium hydrocarbonate, ammonium carbonate, and the like; amines, for example methylamine, dimethylamine, trimethylamine, ethylamine, diethylamine, triethylamine, ethylenediamine, monoethanolamine, N-(β-aminoethyl)ethanolamine (AEEA), hexamethylenediamine (HMDA), diethylenetriamine (DETA), triethylenetetramine (TETA), piperazine anhydrous (PIZ), piperazine hexahydrate, 1-(2-aminoethyl)piperazine (AEPIZ), N-methylpiperazine (MPIZ), and the like.

According to some embodiments of this disclosure, the material or the properties of the abrasive grains are not limited and may be selected depending on the intended use, state of use, and others. Examples of the abrasive grains include inorganic particles, organic particles, and organic-inorganic composite particles. Specific examples of inorganic particles include oxide particles, for example silica particles, aluminum oxide particles, cerium oxide particles, chromium oxide particles, titanium dioxide particles, zirconium oxide particles, magnesium oxide particles, manganese dioxide particles, zinc oxide particles, red iron oxide particles, and the like; nitride particles, for example silicon nitride particles, boron nitride particles, and the like; carbide particles, for example silicon carbide particles, boron carbide particles, and the like; diamond particles; and carbonates, for example calcium carbonate, barium carbonate, and the like. Specific examples of organic particles include, for example polymethyl methacrylate (PMMA) particles or poly(metha)crylate, and polyacrylonitrile. Either a single type or a combination of two or more types of the abrasive grains may be used. Of them, specific examples of silica particles include colloidal silica, fumed silica, and precipitated silica. Either a single type or a combination of two or more types of the silica particles may be used.

Further, (BET) specific surface area diameter (hereinafter, simply referred to as "BET diameter") of the abrasive grains is preferably, but not limited to, 5 nm or more and more preferably 10 nm or more in terms of the polishing efficiency. In terms of obtaining better polishing effects, for example, in terms of increasing effects such as haze reduction or defect removal, the above BET diameter is for example preferably 15 nm or more, more preferably 20 nm or more, and most preferably more than 20 nm. Further, the shape (outer shape) of the abrasive grains may be spherical or may be non-spherical. Specific examples of the shape of non-spherical particles include peanut shapes, cocoon shapes, konpeito shapes, and rugby ball shapes. By way of example, abrasive grains most of which have a peanut shape are preferably used.

Figure 2:
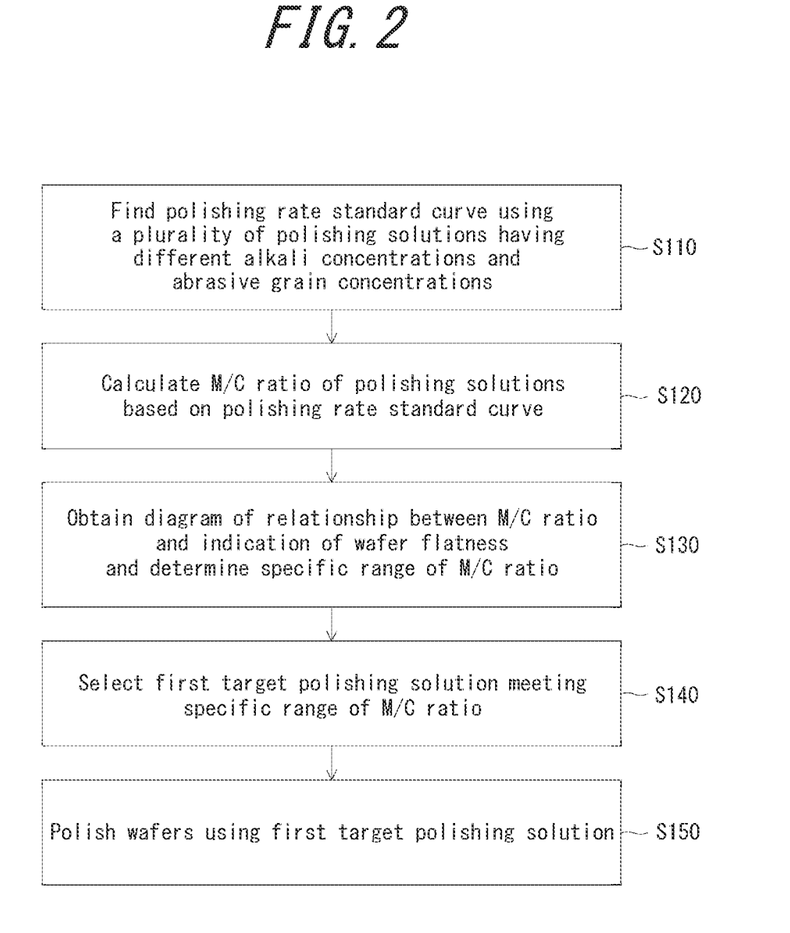
FIG. 2 is a flowchart of a wafer polishing method according to Embodiment 1 of this disclosure.

Referring to FIGS. 1 and 2, an example of a wafer double-side polishing method carried out using the double-side polishing apparatus 100 will now be described. A wafer polishing method according to Embodiment 1 of this disclosure includes the following steps S110 to S140.

In step S110, a first correlation that is the correlation between the alkali concentration and the chemical polishing rate is determined using a plurality of polishing solutions with different alkali concentrations; and a second correlation that is the correlation between the abrasive grain concentration and the mechanical polishing rate is determined using a plurality of polishing solutions having different abrasive grain concentrations. Specifically, in this example, a plurality of polishing solutions with different alkali concentrations are used, and a standard curve of the polishing rate that plots the relationship between the alkali concentration and the chemical polishing rate is found; and a plurality of polishing solutions having different abrasive grain concentrations are used, and a standard curve of the polishing rate that plots the relationship between the abrasive grain concentration and the mechanical polishing rate is found. Specifically, as described above, since the polishing solution progresses chemical mechanical polishing by the combined action of the chemical polishing action and the mechanical polishing action, to separately obtain the action forces of the chemical polishing action and the mechanical polishing action, first, polishing is performed using polishing solutions that only contain alkaline chemicals and contain no abrasive grains and have different alkali concentrations, and the polishing rates at different alkali concentrations are determined. Subsequently, (the order of determinations may be reversed) polishing is performed using polishing solutions that contain a fixed concentration of alkaline chemicals and abrasive grains at different abrasive grain concentrations, and the polishing rates at different abrasive grain concentrations are determined.

Specifically, basic laws of chemical mechanical polishing are based on Preston's equation for CMP (Preston's CMP removal rate)=k (polishing coefficient)×p (pressure)×V (relative velocity); and P (pressure) and V (relative velocity) are influenced by a polishing apparatus. Accordingly, under conditions that P (pressure) and V (relative velocity) are fixed, the formula to calculate the polishing rate of a polishing solution is represented by (Formula 1) below.

$$f([\text{abrasive grains}],[OH^-]) \approx f([\text{abrasive grains}],0) + f(0, [OH^-]), \quad \text{(Formula 1)}$$

where f([abrasive grains],[OH⁻]) represents the polishing rate, f([abrasive grains],0) represents the mechanical polishing rate, and f(0,[OH⁻]) represents the chemical polishing rate. In some embodiments of this disclosure, by way of example, silica can be used as abrasive grains; however, it should be understood that this disclosure is not limited to this.

Polishing is performed using polishing solutions containing only alkaline chemicals and free of abrasive grains at different alkali concentrations, and after determining the relevant polishing rates, (Formula 2) below can be found by quadratic linear regression.

$$f(0,[OH^-]) = a1*X^2 + b1*X + C1, \quad \text{(Formula 2)}$$

where X represents the [OH⁻] concentration, and a1, b1, and C1 represent regression coefficients.

Further, the standard curve describing the chemical polishing rate can be found from (Formula 2) above.

In a similar manner, polishing is performed using polishing solutions containing a fixed concentration of alkaline chemicals and containing no abrasive grains at different abrasive grain concentrations, and after determining the relevant polishing rates, (Formula 3) below can be found by quadratic linear regression.

$$f([\text{abrasive grains}],0) = a2*Y^2 + b2*Y + C2, \quad \text{(Formula 3)}$$

where Y represents the abrasive grain concentration, and a2, b2, and C2 represent regression coefficients. When the [OH⁻] concentration is fixed, C2 represents f(0, [OH⁻]).

Namely, f([abrasive grains],0)=a2*Y 2+b2*Y+f(0, [OH⁻]) can be derived from (Formula 3).

Further, the standard curve describing the mechanical polishing rate can be found from (Formula 3) above.

Although the above polishing rate standard curve is computed by quadratic linear regression, this disclosure is not limited thereto, and it should be understood that those having common knowledge in the art can select a preferred computing type based on the common knowledge in the art to perform curve fitting, thus a more ideal polishing rate standard curve can be found. Examples of the computing type include polynomial regressions such as cubic linear regression, the S function, and trigonometric functions.

Subsequently, in step S120, the ratio of the mechanical polishing rate to the chemical polishing rate of each polishing solution, the mechanical polishing rate/chemical polishing rate ratio (hereinafter may also be referred to as M/C ratio) is calculated based on the first correlation and the second correlation described above (in this example, the respective polishing rate standard curves). Specifically, when the M/C ratio of the polishing solutions is quantified by calculation, a formula used is given as (Formula 4) below.

$$F\left(\frac{M}{C}\right) = \frac{f([\text{abrasive grains}], 0)}{f(0, [OH^-])} \quad \text{(Formula 4)}$$

Here, in performing mechanical polishing, the polishing step cannot proceed without a fixed [OH⁻] concentration. Therefore, the actual mechanical polishing rate is determined by subtracting the chemical polishing rate at the fixed [OH⁻] concentration from the polishing rate, namely, mechanical polishing rate=polishing rate−chemical polishing rate (f([abrasive grains],0)=f([abrasive grains],[OH⁻])−f(0,[OH⁻])) holds; thus, when this formula is substituted into (Formula 4), (Formula 5) can be derived.

$$F\left(\frac{M}{C}\right) = \frac{f([\text{abrasive grains}][OH^-]) - f(0, [OH^-])}{f(0, [OH^-])} \quad \text{(Formula 5)}$$

Accordingly, substituting (Formula 2) and (Formula 3) into (Formula 5) makes it possible to find the M/C ratio of the respective polishing solutions.

In step S130, based on an indication of wafer flatness obtained after polishing using the polishing solutions (for example, thickness distribution (Global Backsurface-referenced Ideal plane/Range, GBIR)(hereinafter simply referred to as "GBIR") or the peripheral flatness (Edge Site Front least sQuares Range, ESFQR)(hereinafter simply referred to as "ESFQR")) and the M/C ratio, the relationship between the M/C ratio and GBIR or ESFQR (relationship diagram) can be obtained. This relationship diagram demonstrates that a desired wafer shape can be obtained at M/C ratios in a specific range. Accordingly, to obtain a target wafer shape, the specific ratio of the M/C ratio may only be determined from the relationship (relationship diagram).

According to some embodiments of this disclosure, when the indication of wafer flatness is GBIR, in terms of making the global shape of a wafer closer to an ideal shape, the lower limit of the M/C ratio is preferably 0.70 or more, more preferably 0.80 or more, further preferably 0.85 or more, yet more preferably 0.90 or more, further more preferably 0.95 or more, most preferably 1.15 or more, and most suitably 1.20 or more. In terms of preventing a wafer from having an excessively convex global shape, the upper limit of the M/C ratio is preferably 1.60 or less, more preferably 1.55 or less, further preferably 1.50 or less, yet more preferably 1.45 or less, and further more preferably 1.40 or less.

According to some embodiments of this disclosure, when the indication of wafer flatness is ESFQR, in terms of obtaining a peripheral flatness of a wafer corresponding to slighter sagging, the lower limit of the M/C ratio is preferably 1.00 or more, more preferably 1.05 or more, further preferably 1.10 or more, yet more preferably 1.15 or more, further more preferably 1.20 or more, most preferably 1.25 or more, and most suitably 1.30 or more. Taking ESFQR into consideration, the upper limit of the M/C is not limited, and is preferably 1.70 or less, more preferably 1.65 or less, further preferably 1.60 or less, yet more preferably 1.55 or less, and further more preferably 1.50 or less.

According to some embodiments of this disclosure, GBIR is an indication of the global flatness with reference to the back surface that can be measured using a wafer flatness measurement system, and is defined as a deviation of the maximum thickness and the minimum thickness of a wafer surface from the back surface of the wafer as a reference plane.

Further, ESFQR is measured using a wafer flatness measurement system and can be evaluated using ESFQR of the edge of a silicon wafer having been subjected to double-side polishing. ESFQR is an indication for evaluation of the flatness of the edge where the flatness is likely low (site flatness), which represents the amount of sagging (edge roll off). ESFQR is defined as the difference between the maximum value and the minimum value of the deviations from the reference plane (Site Best Fit Surface) found by the least square method based on the thickness distribution in unit regions (sites) that are obtained by equally dividing a ring-shaped region along the edge of the wafer in the circumferential direction.

The above indication of wafer flatness is not limited to GBIR and ESFQR and may be for example an indication for evaluation for evaluating the flatness of other semiconductors; examples include SFQR (Site Frontsurface referenced least sQuares/Range) and SBIR (Site Backsurface-referenced Ideal plane/Range).

Next, in step S140, a first target polishing solution meeting the specific range of the M/C ratio is selected. Specifically, the relationship diagram of the M/C ratio and GBIR or ESFQR, described above demonstrates that an ideal wafer shape can be obtained within the specific M/C ratio range, and the abrasive grain concentration and the [OH$^-$] concentration that correspond to the specific M/C ratios are determined based on the first correlation and the second correlation (in this example, the standard curves of the polishing rates). For example, the abrasive grain concentration and the [OH$^-$] concentration of the first target polishing solution are controlled so that the M/C ratio of the first target polishing solution falls within the above specific range.

In step S150, polishing is performed on the wafers using the first target polishing solution. According to some embodiments of this disclosure, wafer polishing may be sizing polishing or unsizing polishing as needed. Further, since the M/C ratio of the first target polishing solution is within the specific range, the GBIR and ESFQR of the wafers having been polished can easily be kept within an ideal range, and the wafers can have a target shape. In general, the ideal shape of a wafer is such that the global shape is slightly concave and the peripheral shape is slightly sagged; however, this disclosure is not limited to this and so the M/C ratio can be set to the specific range depending on the intended wafer shape.

Figure 3:
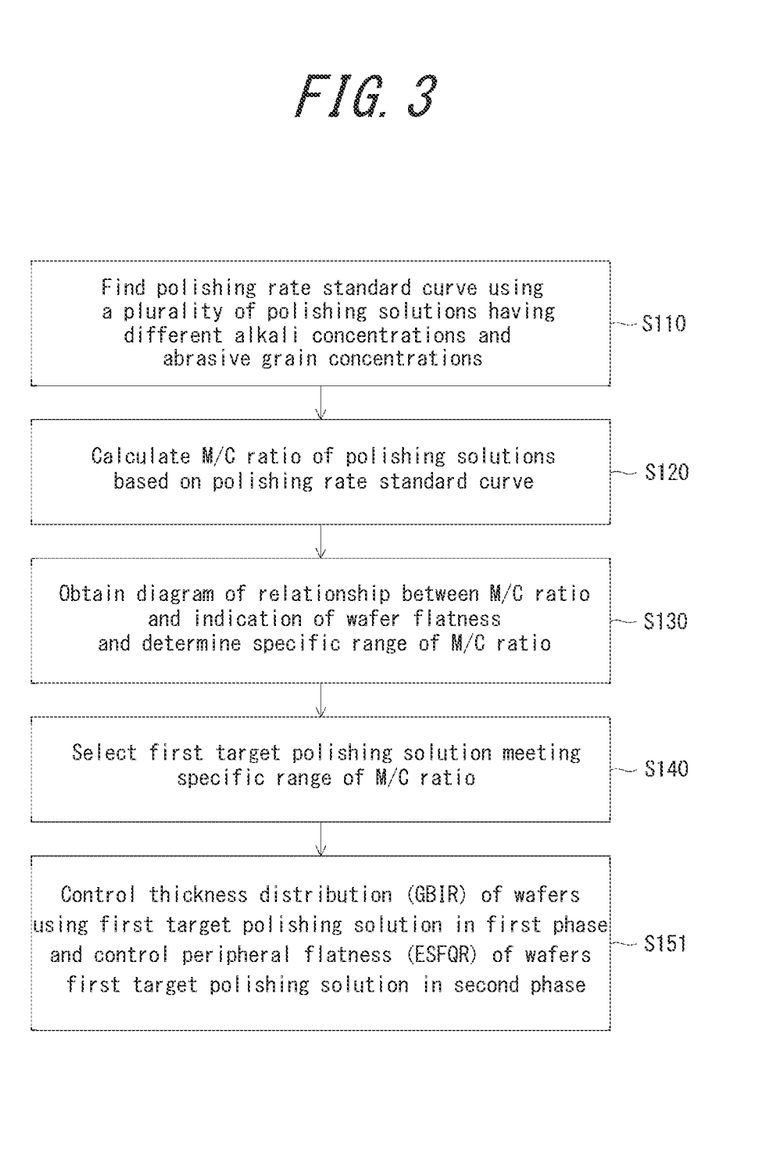
FIG. 3 is a flowchart of a wafer polishing method according to Embodiment 2 of this disclosure.

FIG. 3 presents a flowchart of a wafer polishing method according to Embodiment 2 of this disclosure, and the steps the same as those in FIG. 2 are denoted by the same reference numerals and will not be described again. Reference is made to FIG. 3. Unlike in FIG. 2, the wafers are polished using portions of the first target polishing solution separately in two steps.

In Embodiment 2 of this disclosure, in step S151, in a first stage, the GBIR of the wafers are controlled using the first target polishing solution, and in a second stage, the ESFQR of the wafers is controlled using the first target polishing solution. Specifically, based on the relationship between the M/C ratio and the GBIR or ESFQR (relationship diagram), the M/C ratio is selected to be within a specific range meeting both ideal GBIR and ESFQR, and GBIR of the wafers is controlled in the first stage using the first target polishing solution and the ESFQR of the wafers is controlled in the second stage using the first target polishing solution, thereby more accurately controlling the wafer shape. Further, it must be understood that the first stage and the second stage may use the same polishing machine or different polishing machines. Further, the order of the steps of the first stage and the second stage is only exemplary and this disclosure is not limited to this and so the step of controlling GBIR may be performed after performing the step of controlling ESFQR.

Figure 4:
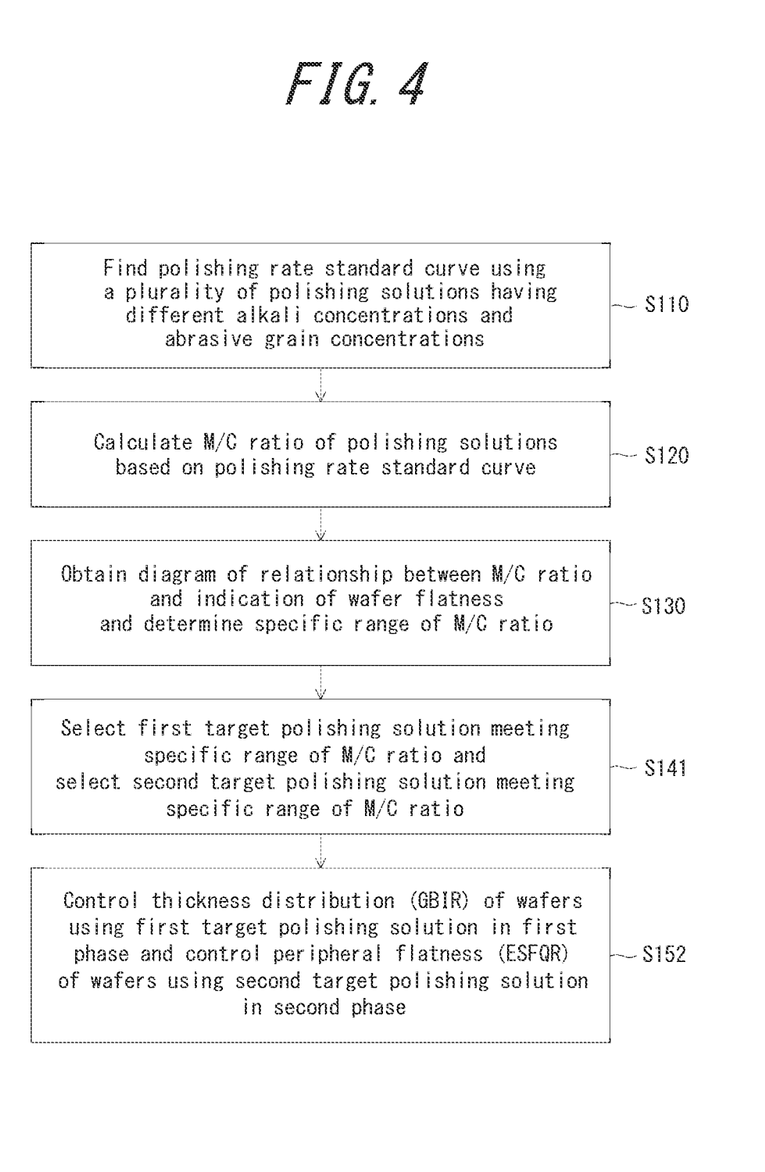
FIG. 4 is a flowchart of a wafer polishing method according to Embodiment 3 of this disclosure.

FIG. 4 presents a flowchart of a wafer polishing method according to Embodiment 3 of this disclosure, and the steps the same as those in FIG. 2 are denoted by the same reference numerals and will not be described again. Reference is made to FIG. 4. Unlike in FIG. 2, a first target polishing solution and a second target polishing solution are selected based on the diagram of the relationship between the M/C ratio and the indication of wafer flatness, and the GBIR is controlled using the first target polishing solution in the first stage and the ESFQR is controlled using the second target polishing solution in the second stage.

In Embodiment 3 of this disclosure, in step S141, a first target polishing solution meeting the specific range of the M/C ratio and a second target polishing solution meeting the specific range of the M/C ratio are selected. Specifically, based on the diagram of the relationship between the M/C ratio and the GBIR or ESFQR, the specific range of the M/C ratio for GBIR can be determined and the specific range of the M/C ratio for ESFQR can be determined. Accordingly, different specific ranges of the M/C ratio may be selected for GBIR and ESFQR, and based on the M/C ratios determined above, the first target polishing solution is controlled to meet the M/C ratios for GBIR, and the second target polishing solution is controlled to meet the M/C ratios for ESFQR at the same time.

Next, in step S152, the GBIR of the wafers is controlled using the first target polishing solution in the first stage, and the ESFQR of the wafers is controlled using the second target polishing solution in the second stage. Specifically, the wafers polished using the first target polishing solution in the first stage can have a wafer shape meeting ideal GBIRs, and wafers polished using the second target polishing solution in the subsequent second stage can have a wafer peripheral shape meeting ideal ESFQRs.

Further, it must be understood that the first stage and the second stage may use the same polishing machine or different polishing machines as in Embodiment 2. Further, the order of the steps of the first stage and the second stage is only exemplary and this disclosure is not limited to this and so the step of controlling GBIR using the first target polishing solution may be performed after performing the step of controlling ESFQR using the second target polishing solution.

Figure 5:
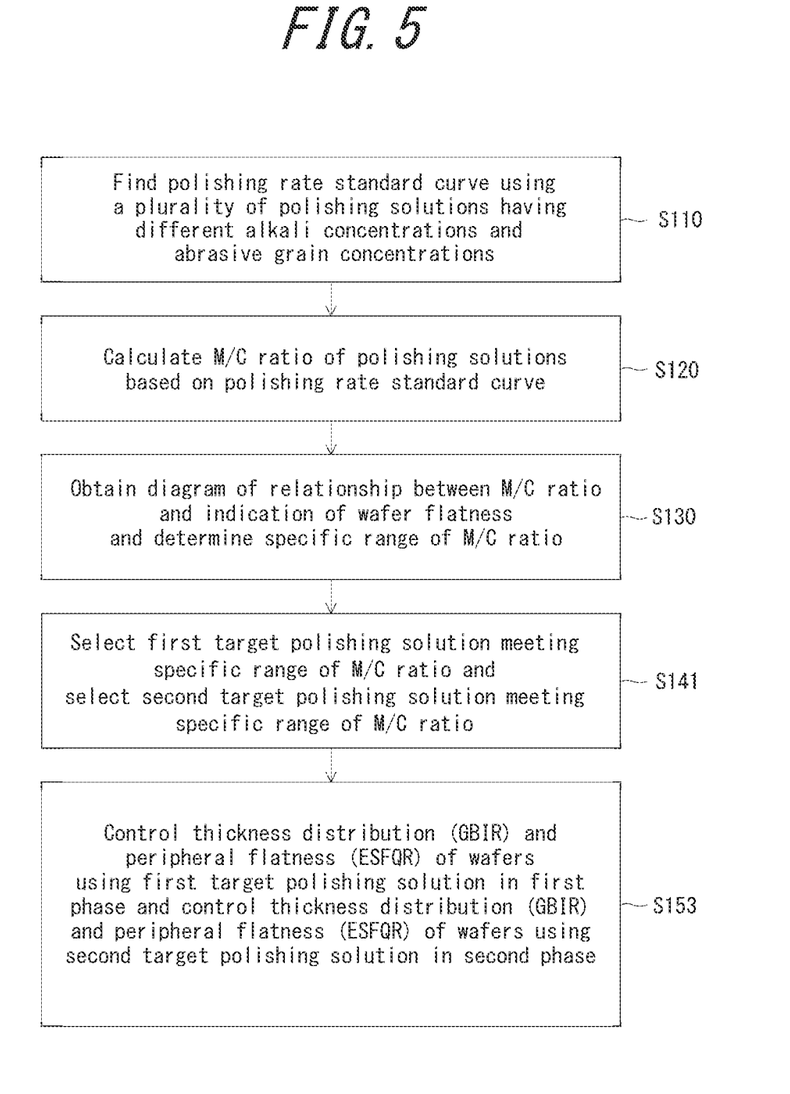
FIG. 5 is a flowchart of a wafer polishing method according to Embodiment 4 of this disclosure.

FIG. 5 presents a flowchart of a wafer polishing method according to Embodiment 4 of this disclosure, and the steps the same as those in FIG. 2 are denoted by the same reference numerals and will not be described again. Reference is made to FIG. 5. Unlike in FIG. 2, a first target polishing solution and a second target polishing solution are selected based on the diagram of the relationship between the M/C ratio and the indication of wafer flatness, and the GBIR and ESFQR of the wafers are controlled using the first target polishing solution in the first stage and the GBIR and ESFQR are controlled using the second target polishing solution in the second stage.

According to Embodiment 4 of this disclosure, in step S141, a first target polishing solution meeting the specific range of the M/C ratio and a second target polishing solution meeting the specific range of the M/C ratio are selected. Specifically, based on the diagram of the relationship between the M/C ratio and the GBIR or ESFQR, the specific range of the M/C ratios for GBIR or ESFQR can be determined. Further, based on the M/C ratios determined above, the first target polishing solution is controlled to meet the M/C ratios for GBIR and ESFQR, and the second target polishing solution is controlled to meet the M/C ratio for GBIR and ESFQR at the same time. Although the M/C ratios of both the first target polishing solution and the second target polishing solution meet the above specific ranges of the M/C ratio, the M/C ratios may be different from one another.

Next, in step S153, the GBIR and ESFQR of the wafers are controlled using the first target polishing solution in the first stage, and the GBIR and ESFQR of the wafers are controlled using the second target polishing solution in the second stage. Specifically, the wafers polished using the first target polishing solution in the first stage can have a wafer shape of almost ideal GBIR and ESFQR, and wafers polished using the second target polishing solution in the subsequent second stage can have a wafer peripheral shape of more ideal GBIR and ESFQR. Further, in Embodiment 4, different polishing machines are preferably used in the first stage and the second stage; however, this disclosure is not limited thereto, and the same polishing machine may be used. Note however that two-stage polishing is performed in that case.

Examples

The wafer polishing method and the wafer production method of this disclosure will now be described in more detail using Examples and others; however, the scope of the inventions is not limited to those Examples and others.

Silicon wafers obtained by production using a predetermined method were subjected to polishing using a Type_28B double-side polishing machine as illustrated in FIG. 1. As described below, a polishing machining test was performed under unsizing conditions. In Example 1, polishing was performed by supplying a polishing solution containing no abrasive grains and containing alkaline chemicals ([OH$^-$] concentration: 0.00026 mol/L), and the polishing time was set to 60 min. The polishing rate was obtained from the silicon wafers having been subjected to polishing.

In Examples below, silicon wafers were each subjected to polishing under the conditions of the polishing solutions as given in Table 1 in a similar manner to that in Example 1 except for the conditions of the alkaline chemical concentration and the abrasive grain concentration. Specifically, in Example 2 and Comparative Example 1, polishing was performed using polishing solutions that did not contain abrasive grains and contained alkaline chemicals ([OH$^-$] concentration was 0.00118 mol/L and 0.00186 mol/L), and the polishing rates of the polishing solutions were determined. Further, the variation of the polishing rates in the examples were found with reference to the polishing rate of Comparative Example 1.

Moreover, in Examples 3 to 5, polishing was performed using polishing solutions containing a fixed concentration of alkaline chemicals (0.00186 mol/L) and containing different concentrations of abrasive grains, and the polishing rates of the polishing solutions were obtained. In these Examples, the abrasive grains used silica ($SiO_2$) particles having a (BET) average particle size of 20 nm to 30 nm, for example.

Figure 6:
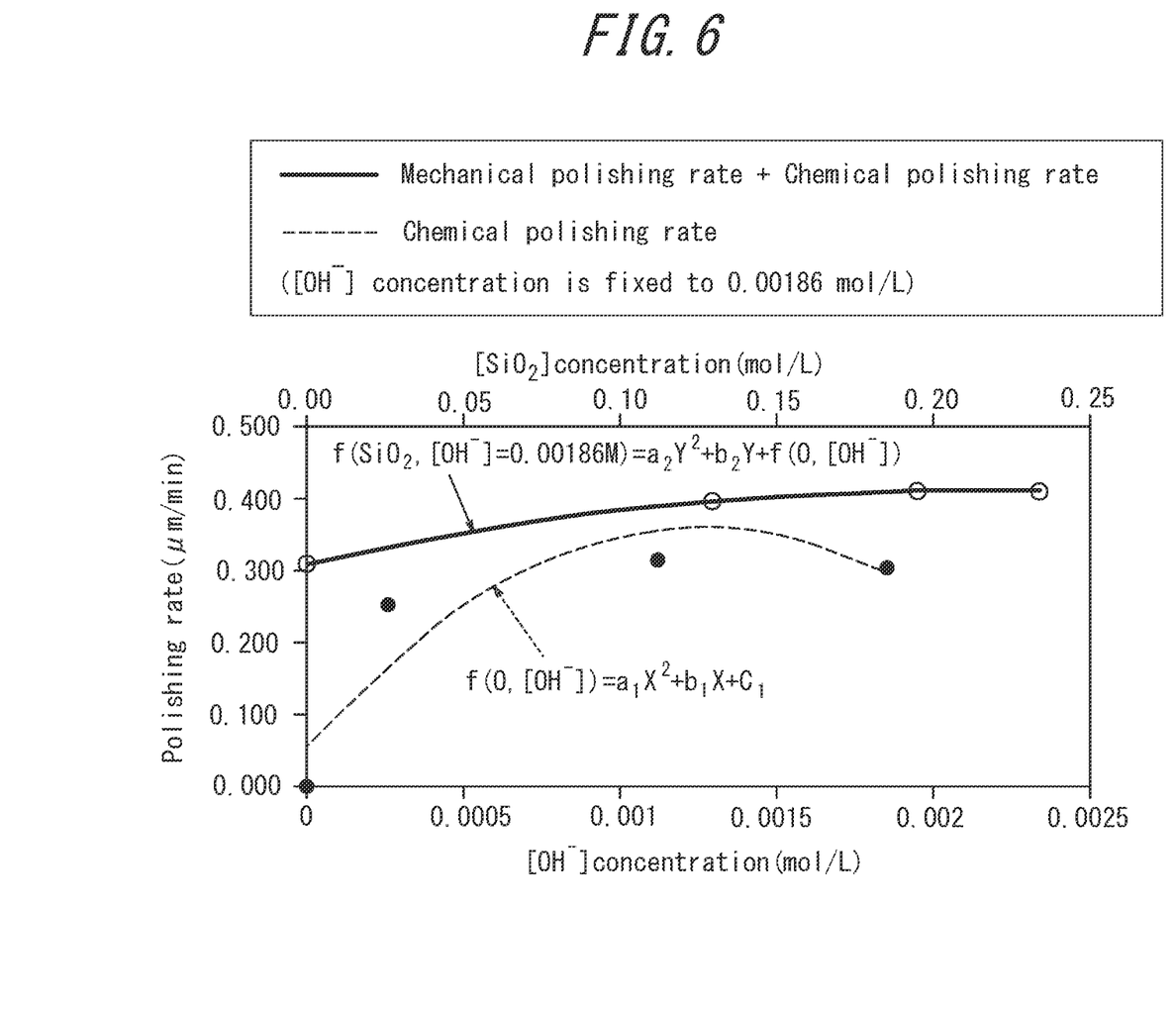
FIG. 6 is a graph of the correlation between the polishing rate, and the alkali concentration and the abrasive grain concentration of polishing solutions in Examples of this disclosure.

From the results of the concentrations and the polishing rates in Examples 1, 2 and Comparative Example 1, (Formula 2) above was found by quadratic linear regression. This gives a standard curve for the chemical polishing rate. Similarly, from the results of the concentrations and the polishing rates in Examples 3 to 5 and Comparative Example 1, (Formula 3) above was found by quadratic linear regression. This gives a standard curve for the mechanical polishing rate. The above results are as given in FIG. 6.

Next, (Formula 2) and (Formula 3) are substituted into (Formula 5) above, and the M/C ratios of the polishing solutions were determined as follows.

$$F\left(\frac{M}{C}\right) = \frac{f([SiO_2][OH^-]) - f(0, [OH^-])}{f(0, [OH^-])}$$

In Examples 6 to 8, polishing was performed under the conditions of the polishing solutions given in Table 2, and the polishing rate of each polishing solution was obtained; and the polishing rate, the alkaline chemical concentration, and the silica concentration in each of Examples 3 to 8 and Comparative Example 1 were substituted into the above formulae to determine the M/C ratios in the Examples.

<GBIR Measurement>

The surface of each wafer in Examples 3 to 8 and Comparative Example 1 was subjected to a measurement using a wafer flatness measurement system (Wafersight manufactured by KLA-Tencor Corporation)(measuring range: 298 mm, edge exclusion: 1 mm), thereby determining the thickness and GBIR of each wafer, determining the variation of the GBIR in each of Examples 3 to 8 with reference to the GBIR in Comparative Example 1, and creating a diagram of the relationship between the variation of the GBIR and the M/C ratio. The results are as given in FIG. 7.

<ESFQR Measurement>

Figure 8:
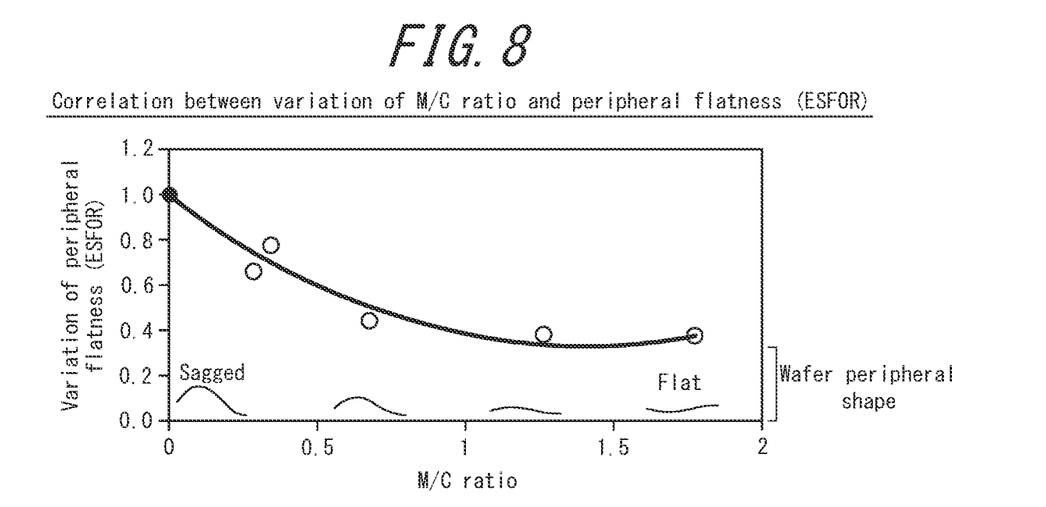
FIG. 8 is a graph illustrating the correlation between the variation of the ratio of mechanical polishing rate/chemical polishing rate (M/C ratio) and the peripheral flatness (ES-FQR) in Examples of this disclosure.

The ESFQR (angle: 5°×length: 35 mm) of each wafer in Examples 3 to 8 and Comparative Example 1 was measured using a wafer flatness measurement system (Wafersight manufactured by KLA-Tencor Corporation with a measuring range of 298 mm and an edge exclusion of 1 mm), the variation of the ESFQR in each of Examples 3 to 8 was determined with reference to the ESFQR in Comparative Example 1, and a diagram of the relationship between the variation of the ESFQR and the M/C ratio was created. The results are as given in FIG. 8.

TABLE 1

| | Polishing machine | X [OH$^-$] concentration (mol/L) | Y [SiO$_2$] concentration (mol/L) | Polishing rate variation (%) | M/C ratio | GBIR variation | Global shape | ESFQR variation | Peripheral shape |
|---|---|---|---|---|---|---|---|---|---|
| Example 1 | Type_28B | 0.00026 | 0 | 0.8306 | 0 | 1.07 | Concave | 0.82 | Sagged |
| Example 2 | Type_28B | 0.00118 | 0 | 1.0293 | 0 | 0.79 | Concave | 0.79 | Sagged |
| Comparative Example 1 | Type_28B | 0.00186 | 0 | 1 | 0 | 1 | Concave | 1 | Sagged |
| Example 3 | Type_28B | 0.00186 | 0.12 | 1.2964 | 0.302 | 0.95 | Concave | 0.66 | Sagged |
| Example 4 | Type_28B | 0.00186 | 0.18 | 1.3224 | 0.352 | 0.83 | Concave | 0.78 | Sagged |
| Example 5 | Type_28B | 0.00186 | 0.22 | 1.342 | 0.354 | 0.73 | Concave | 0.77 | Sagged |

TABLE 2

| | Polishing machine | X [OH⁻] concentration (mol/L) | Y [SiO₂] concentration (mol/L) | Polishing rate variation (%) | M/C ratio | GBIR variation | Global shape | ESFQR variation | Peripheral shape |
|---|---|---|---|---|---|---|---|---|---|
| Comparative Example 1 | Type_28B | 0.00186 | 0 | 1 | 0 | 1 | Concave | 1 | Sagged |
| Example 3 | Type_28B | 0.00186 | 0.12 | 1.2964 | 0.302 | 0.95 | Concave | 0.66 | Sagged |
| Example 4 | Type_28B | 0.00186 | 0.18 | 1.3224 | 0.354 | 0.83 | Concave | 0.78 | Sagged |
| Example 5 | Type_28B | 0.00186 | 0.22 | 1.342 | 0.352 | 0.73 | Concave | 0.77 | Sagged |
| Example 6 | Type_28B | 0.00021 | 0.21 | 0.9707 | 0.688 | 0.64 | Concave | 0.44 | Sagged |
| Example 7 | Type_28B | 0.00005 | 0.22 | 0.798 | 1.269 | 0.44 | Slightly convex | 0.39 | Slightly sagged |
| Example 8 | Type_28B | 0.00001 | 0.2 | 1.0977 | 1.679 | 1.15 | Convex | 0.36 | Flat |

Figure 7:
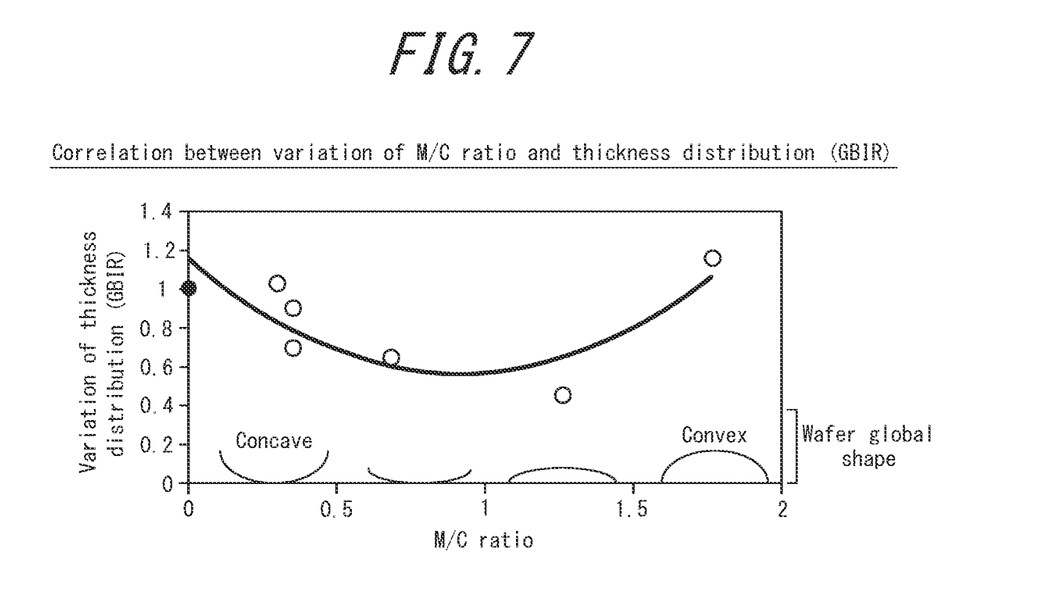
FIG. 7 is a graph illustrating the correlation between the variation of the ratio of mechanical polishing rate/chemical polishing rate (M/C ratio) and the thickness distribution (GBIR) of wafers in Examples of this disclosure.

As illustrated in FIG. 7, when double-side polishing is performed, to optimize the GBIR of a wafer surface, the M/C ratio is preferably 0.7 or more and 1.4 or less. When a wafer having been polished is to have a slightly convex shape, the M/C ratio is preferably 1.0 or more and 1.4 or less. Further, as given in FIG. 8, to optimize the ESFQR and to achieve a state where a wafer having been polished is from slightly sagged to flat, the M/C ratio is preferably around 1.2 to 1.7. Accordingly, when considering GBIR and ESFQR at the same time, the M/C ratio is preferably 1.2 or more and 1.4 or less. Thus, the above specific ranges of the M/C ratios make it possible to easily control the conditions in the predetermined polishing solutions, which allows the subsequent wafers to have a desired wafer shape.

To consider the correlations between the M/C ratio and the GBIR and ESFQR in performing polishing using different polishing machines, polishing of silicon wafers was performed using a Type_20B double-side polishing machine of the arrangement and operation the same as those of the double-side polishing machine in FIG. 1 except that the carrier diameter was 20 inches in Examples 9 and 10, in which polishing solutions the same as those in Examples 4 and 7, respectively were used. The polishing time was set to 60 min. The polishing rate of the silicon wafers having been subjected to polishing was obtained. Subsequently, the variations of the GBIR and ESFQR of the wafers were found by the same manner as described above. The results are given in Table 3.

Accordingly, the difference between the Type_28B and Type_20B double-side polishing machines is found only in the variation of the value of the mechanical polishing rate M. Accordingly, from this result, the M/C ratios in Examples 9 and 10 can be calculated by (Formula 6) below.

$$M/C \text{ ratio (Type\_20B)} = \frac{(\text{Polishing rate } M/C \text{ ratio (Type\_28B)} \times \text{Polishing rate (Type\_20B)})}{(\text{Polishing rate (Type\_28B)})} \quad \text{(Formula 6)}$$

Figure 9:
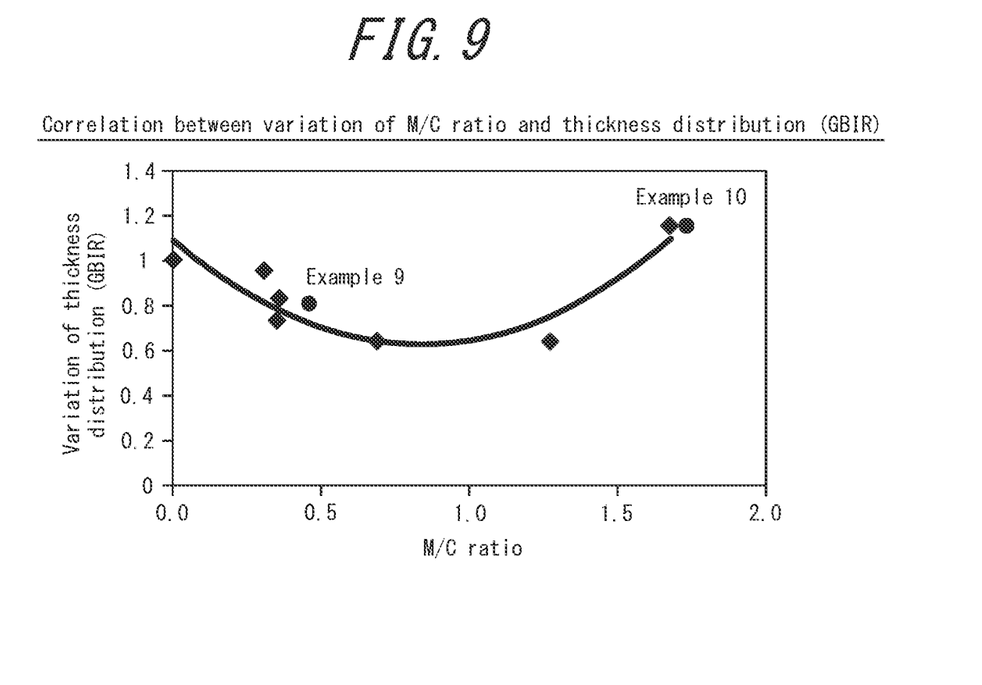
FIG. 9 is a graph illustrating the correlation between the variation of the ratio of mechanical polishing rate/chemical polishing rate (M/C ratio) of different polishing apparatuses and the thickness distribution (GBIR) of wafers in Examples of this disclosure.
Figure 10:
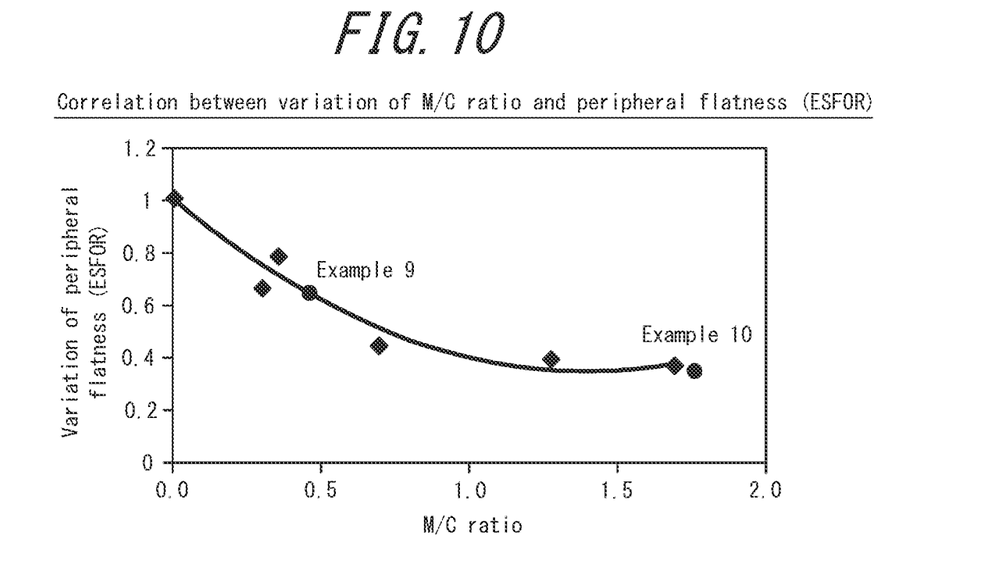
FIG. 10 is a graph illustrating the correlation between the variation of the ratio of mechanical polishing rate/chemical polishing rate (M/C ratio) of different polishing apparatuses and the peripheral flatness (ESFQR) in Examples of this disclosure.

Based on the M/C ratios, GBIRs, and ESFQRs given in Table 3, a diagram of the relationship between the M/C ratio and the GBIR and ESFQR was created. The results are given in FIG. 9 and Table 10. The relationship diagrams in FIG. 9 and FIG. 10 demonstrate that the M/C ratios still had correlations with the GBIR and ESFQR in agreement with Examples above. Specifically, even when the polishing machine is changed, the M/C ratio can still be calculated, and the specific ranges of the M/C ratios can be determined separately depending on the different polishing machines to be used, and when polishing is performed with a different polishing machine using new polishing solutions for which the specific ranges have been separately determined, an ideal wafer shape can still be obtained.

TABLE 3

| | Polishing machine | X [OH⁻] concentration (mol/L) | Y [SiO₂] concentration (mol/L) | Polishing rate variation (%) | M/C ratio | GBIR variation | Global shape | ESFQR variation | Peripheral shape |
|---|---|---|---|---|---|---|---|---|---|
| Example 4 | Type_28B | 0.00186 | 0.18 | 1.3224 | 0.354 | 0.83 | Concave | 0.78 | Sagged |
| Example 7 | Type_28B | 0.00005 | 0.22 | 0.798 | 1.269 | 0.44 | Slightly convex | 0.39 | Slightly sagged |
| Example 9 | Type_20B | 0 00186 | 0.18 | 1.8013 | 0.482 | 0.81 | Convex | 0.63 | Sagged |
| Example 10 | Type_20B | 0.00005 | 0.22 | 1.0977 | 1.746 | 1.16 | Convex | 0.37 | Flat |

For the M/C ratios in Examples 9 and 10, if the same polishing solution is used at the same concentration, C in the chemical polishing rate represented by the following formula is fixed.

$$F\left(\frac{M}{C}\right)$$

The features of some embodiments of this disclosure have been generally described above to allow those having common knowledge in the art to readily understand the modes of this disclosure. Those having common knowledge in the art should understand that the same objectives are achieved and/or the same benefits are obtained as the embodiments described in this specification using a production process and designing based on this disclosure. Further, those having common knowledge in the art will understand that features equivalent to ones described above are within the scope of protection without departing from the spirit of this disclosure, and the features of this disclosure can be changed, substituted, and modified without departing from the spirit of this disclosure.

REFERENCE SIGNS LIST

100: Double-side polishing apparatus
10: Upper plate
11: Upper polishing pad
20: Lower plate
21: Lower polishing pad
30: Carrier plate
31: Wafer retainer opening
40: Sun gear
50: Internal gear
60: Polishing solution
110: Elevating mechanism
S110, S120, S130, S140, S141, S142, S150, S151, S152, S153: Step
WF: Silicon wafer

The invention claimed is:

1. A wafer polishing method comprising:
a step of determining a first correlation that is a correlation between an alkali concentration and a chemical polishing rate, using a plurality of polishing solutions with different alkali concentrations and determining a second correlation that is a correlation between an abrasive grain concentration and a mechanical polishing rate, using a plurality of polishing solutions having different abrasive grain concentrations;
a step of calculating mechanical polishing rate/chemical polishing rate that is a ratio of the mechanical polishing rate to the chemical polishing rate for each of the plurality of polishing solutions based on the first correlation and the second correlation;
a step of obtaining a relationship between the ratio of the mechanical polishing rate to the chemical polishing rate and one or more indications of wafer flatness and determining a specific range of the ratio of the mechanical polishing rate to the chemical polishing rate;
a step of selecting a first target polishing solution that meets the specific range of the ratio of the mechanical polishing rate to the chemical polishing rate based on the first correlation and the second correlation; and
a step of polishing wafers using the first target polishing solution.

2. The wafer polishing method according to claim 1, wherein the one or more indications of wafer flatness include GBIR.

3. The wafer polishing method according to claim 1, wherein the specific range of the ratio of the mechanical polishing rate to the chemical polishing rate is 0.70 or more and 1.60 or less.

4. The wafer polishing method according to claim 1, wherein the one or more indications of wafer flatness include ESFQR.

5. The wafer polishing method according to claim 4, wherein the specific range of the ratio of the mechanical polishing rate to the chemical polishing rate is 1.20 or more and 1.70 or less.

6. The wafer polishing method according to claim 4, wherein the one or more indications of wafer flatness further include GBIR, and the specific range of the ratio of the mechanical polishing rate to the chemical polishing rate is 1.20 or more and 1.40 or less.

7. The wafer polishing method according to claim 1, wherein the step of polishing further includes a step of controlling GBIR of the wafers in a first stage and a step of controlling ESFQR of the wafers in a second stage.

8. The wafer polishing method according to claim 7, wherein the step of polishing further includes a step of performing the first stage with a first polishing machine using the first target polishing solution and performing the second stage with a second polishing machine using the first target polishing solution.

9. The wafer polishing method according to claim 7, wherein the step of polishing further includes a step of performing the first stage and the second stage with a first polishing machine using the first target polishing solution and performing the first stage and the second stage with a second polishing machine using the first target polishing solution.

10. The wafer polishing method according to claim 7, further comprising a step of selecting a second target polishing solution meeting the specific range of the ratio of the mechanical polishing rate to the chemical polishing rate.

11. The wafer polishing method according to claim 10, wherein the step of polishing further includes a step of performing the first stage with a first polishing machine using the first target polishing solution and performing the second stage with a second polishing machine using the second target polishing solution.

12. The wafer polishing method according to claim 10, wherein the step of polishing further includes a step of performing the first stage and the second stage with a first polishing machine using the first target polishing solution and performing the first stage and the second stage with a second polishing machine using the second target polishing solution.

13. A wafer production method comprising slicing a single crystal ingot grown by the Czochralski process to obtain wafers to be polished, and then subjecting the wafers to be polished to the wafer polishing method according to claim 1.

* * * * *